Dec. 22, 1953
W. H. BRATTAIN
2,663,829
SEMICONDUCTOR TRANSLATOR
Filed Dec. 29, 1948

INVENTOR
W. H. BRATTAIN
BY
ATTORNEY

Patented Dec. 22, 1953

2,663,829

UNITED STATES PATENT OFFICE 2,663,829

SEMICONDUCTOR TRANSLATOR

Walter H. Brattain, Morristown, N. J., assignor to Bell Telephone Laboratories, Incorporated, New York, N. Y., a corporation of New York Application December 29, 1948, Serial No. 67,781

16 Claims. (Cl. 317—235)

This invention relates to translating devices and more particularly to semiconductor translators and to methods of making them.

In accordance with the invention herein disclosed, semi-conductor translators having point contacts or like connections may be improved by a "forming" treatment of certain of such connections. The treatment is peculiar to devices having more than two connections, e. g., a semiconductor triode amplifier such as disclosed in the application of J. Bardeen and W. H. Brattain, Serial No. 33,466, filed June 17, 1948, now Patent 2,524,035, which issued October 3, 1950, as contrasted to a forming treatment of semiconductor diodes such as point contact crystal rectifiers.

In amplifiers and like devices of this type the input may be connected between a base connection and a restricted area or point contact connection called the emitter, and the output between the same base connection and another restricted area or point contact connection denoted as the collector.

An object of this invention is to improve semiconductor translators of the type indicated whereby greater power gains, for example, may be attained.

One feature of this invention resides in forming one restricted area connection of a semiconductor translator while the other is also in circuit so as to control the forming operation.

Another feature of this invention lies in particularly locating the emitter relative to the collector to advantageously affect the forming operation.

Figure 1:
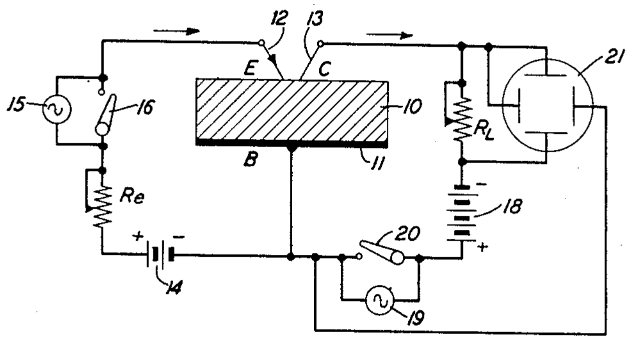
Figure 2:
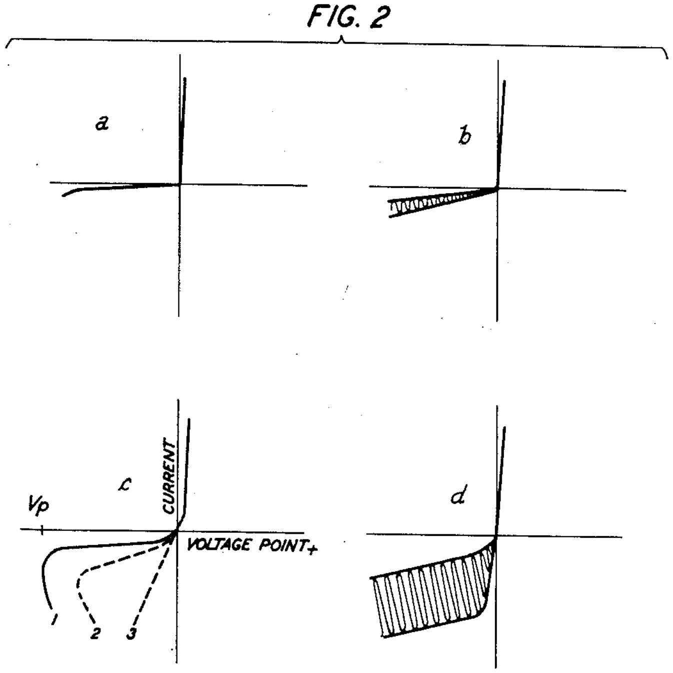

Other and further objects and features of this invention will appear more fully and clearly from the following description of illustrative embodiments thereof taken in connection with the appended drawings in which:

Fig. 1 shows a semiconductor translator in diagrammatic form with circuit means connected thereto for carrying out the forming operation of this invention; and Fig. 2 shows at *a* to *d* curves useful in explaining the invention.

Semiconductors which have been found suitable for use in devices of the type to which this invention pertains include germanium and like materials containing minute quantities of significant impurities which comprise one way of determining the conductivity type (either N or P-type) of the semiconductive material. The conductivity type may also be determined by energy relations within the semiconductor. For a more detailed explanation, reference is made to Patent 2,524,035 of J. Bardeen and W. H. Brattain.

The terms N-type and P-type are applied to semiconductive materials which tend to pass current easily when the material is respectively negative or positive with respect to a conductive connection thereto and with difficulty when the reverse is true, and which also have consistent Hall and thermoelectric effects.

The expression "significant impurities" is here used to denote those impurities which affect the electrical characteristics of the materials such as its resistivity, photosensitivity, rectification and the like, as distinguished from other impurities which have no apparent effect on these characteristics. The term "impurity" is intended to include intentionally added constituents as well as any which may be included in the basic material as found in nature or as commercially available.

Referring to Fig. 1, 10 is a body or block of a semiconductive material such as a germanium material to which is made an ohmic connection 11 and restricted area or point contact connections 12 and 13. The connections 11, 12 and 13 are called the base, emitter, and collector, respectively, and have been additionally marked B, E and C, respectively, in accordance with this nomenclature.

The block 10 may be made of a semiconductive material of given conductivity type such as N-type germanium material, which may be prepared in the manner described in the application of J. H. Scaff and H. C. Theuerer Serial No. 638,351, filed December 29, 1945, now Patent No. 2,602,211, or as described in "Crystal Rectifiers" by Torrey and Whitmer, volume 15 of Radiation Laboratory Series (MIT).

The connections 12 and 13 may be of Phosphor bronze, tungsten or other suitable contact material.

Connected between the base 11 and the emitter 12 are a biasing source such as a battery 14, a resistor $R_E$ and a signal source 15 which may be provided with a short-circuiting switch 16. The battery 14 will, as shown, ordinarily have its positive pole connected to the emitter 12. In the collector circuit are connected between the collector 13 and the base 11, a load resistor $R_L$, a biasing source such as battery 18, and a source of alternating voltage 19. The source 19 may be provided with a short-circuiting switch 20. The battery 18 has its negative pole connected to the collector 13.

In order to observe the voltage-current characteristic of the collector, the voltage between the collector 13 and the base 11 and the voltage drop across the load resistor $R_L$ may be impressed on the horizontal and vertical plates, respectively, of an oscilloscope 21.

The signal source 15 may be capable of providing a 1,000-cycle per second signal of relatively low amplitude. The source 19 of alternating voltage may be 60 cycles per second variable from 0 to 160 volts. The bias sources 14 and 18 may be adjustable as to voltage and the resistors $R_E$ and $R_L$ may also be made adjustable.

If the emitter circuit is open a curve like that at *a* of Fig. 2 will be obtained for the collector when the 60-cycle voltage is applied. This is the rectifier characteristic of the collector. If the emitter circuit is closed and a signal applied thereto, a curve such as *b* of Fig. 2 will be obtained. The effect of the emitter in Fig. 2*b* may be regarded as a modification of the reverse or high impedance portion of the collector characteristic. Modulation of the collector pattern, as shown in Fig. 2*b* is caused by the signal in the emitter circuit. This curve may in some cases represent slight amplification prior to forming.

If the voltage applied to the collector is increased, the voltage-current pattern will go "over the peak" as indicated by the negative resistance portion of the curves in Fig. 2*c*. The curve at 1 is for an open-circuited emitter. With the emitter circuit closed curves like 2 or 3 may be obtained. A shift from position 1 towards 3 may be caused by an increase of emitter or collector current. The forming of the collector may be overdone by passing too much current therethrough. This may be avoided by controlling the values of series resistance and applied voltage.

After proper forming, the collector characteristic will be like that shown in Fig. 2*d*. It will be noted that the amplitude of the signal is considerably increased as compared with Fig. 2*b*. The magnitude of the modulation in the collector pattern may be used as a rough measure of the gain due to forming and as a guide in performing the forming process.

Some factors of importance are: emitter-collector spacing, emitter circuit resistance, and collector circuit resistance. Too great spacing between the emitter and collector may remove the effect of the emitter. Spacings of .001 to .004 inch have been found effective in particular devices of the construction illustrated in Fig. 1. The emitter circuit resistance $R_E$ must not be so high as to unduly limit the emitter current. Forming has been obtained with values up to about 1,000 ohms, and resistances, of a few hundred ohms appear preferable. The load resistance $R_L$ in the collector circuit should be relatively high, e. g. from 1,000 to 10,000 ohms.

The bias voltage on the emitter should be relatively low, i. e., from 0 to 1.0 volt. The 1,000-cycle per second signal in the emitter circuit may be of the order of 0.1 volt. The direct-current biasing source 18 may be omitted and the 60-cycle alternating current used alone or battery 18 may have a fairly high voltage so that the biasing for forming may be substantially all direct current with just enough superposed alternating current for observation purposes.

When a restricted area connection on a semiconductive body e. g. a collector connection on N-type germanium material, is formed, there appears to be a change in the material adjacent this connection. This may be called a "formed" or "transformer" region. The effect of the emitter being in circuit during forming appears to be a broadening of the transformed region so that its edge is relatively close to the emitter, thus enhancing the emitter-collector interaction in use. Although this broadening may be symmetrical about the collector the tendency is for it to be unsymmetrical in the direction of the emitter.

Reference is made to the application of W. G. Pfann, Serial No. 67,797, filed December 29, 1948, issued December 11, 1951, as Patent 2,577,803, for other details and features of this type of forming.

Although this invention has been described with respect to a particular, illustrative modification thereof, it will be understood that various changes may be made therein without departing from the spirit and scope of the invention.

What is claimed is:

1. The method of improving the amplification of a semiconductive amplifier having rectifying contacts on a semiconductive body, that comprises applying a relatively high voltage between one of said rectifying contacts and an ohmic contact to said semiconductive body, poled to force electrons into the semiconductive body while another rectifying contact is connected to the semiconductive body through the ohmic contact.

2. The method of forming a connection to a translating device comprising a body of semiconductive material of given conductivity type having at least three spaced connections, two of which are of the restricted area type and the third being a large area connection, that comprises applying a voltage between one restricted area connection and a large area connection sufficient to alter permanently the electrical characteristics of the semiconductive body in the region of said restricted area connection while the other restricted area connection is connected to said large area connection.

3. The method of forming the collector connection of an N-type germanium translator having emitter, collector and base connections, that comprises applying a positive bias and a signal voltage between the emitter and the base connections, applying a variable negative bias between the collector and the base connections, increasing the collector bias while observing the effect of the signals in the collector circuit until improvement in amplification of said signals is indicated, and then removing the applied voltages.

4. The method of forming a semiconductive circuit element comprising a body of N-type germanium material having an emitter, a collector and a base connection, that comprises applying a relatively high voltage between the collector and base connections while the emitter and base connections are interconnected.

5. A semiconductive circuit element comprising a body of N-type germanium material having an input, an output and a base connection, said body having therein immediately adjacent said output connection an unsymmetrical electrically formed region, said region extending from said output connection toward said input connection a greater distance than it extends in the opposite direction.

6. The method of improving the amplification of a semiconductor translator comprising a body of N-type germanium material having an emitter, a collector and a base connection, that comprises applying a voltage between the emitter and the base connection and another voltage between the collector and base connection, the emitter voltage being of the order of one volt or less, positive and the collector voltage being varied between zero and about one hundred thirty-five volts, negative, to a value that places the voltage-current characteristic of the collector in the negative resistance region.

7. The method of improving amplification of a semiconductor translator comprising a body of N-type germanium material having an emitter, a collector and a base connection, that comprises adjusting the emitter-collector spacing to a value on the order of .001 to .004 inch, and applying a voltage between the emitter and the base connections and another voltage between the collector and the base connections, the emitter voltage being of the order of one volt or less, positive, and the collector voltage being varied between zero and about one hundred thirty-five volts, negative, to a value that has a collector voltage-current characteristic in the negative resistance region.

8. The method of improving the amplification of a semiconductor translator comprising a body of N-type germanium material having an emitter, a collector and a base connection, that comprises adjusting the spacing between the emitter and collector connections to a value on the order of .001 to .004 inch and applying a reverse voltage to the collector sufficient to carry the collector voltage-current characteristic into the negative resistance region while both the emitter and collector are connected to the base connection.

9. A semiconductive circuit element comprising a body of N-type germanium material having an input, an output and a base connection, the input and output connections being spaced on the order of .001 to .004 inch, and an unsymmetrical electrically formed region immediately adjacent said output connection, said region extending from said output connection toward said input connection a greater distance than it extends in the opposite direction.

10. An amplifying device comprising a body of semiconductive material of a given conductivity type having an emitter, a collector and a base connection, and an unsymmetrical electrically formed region immediately adjacent said output connection, said region extending from said output connection toward said input connection a greater distance than it extends in the opposite direction.

11. An amplifying device comprising a body of semiconductive material of a given conductivity type having spaced restricted area connections and a large area connection on said body, and an unsymmetrical electrically formed region immediately adjacent one of said restricted area connections, said region extending from said one restricted area connection towards another restricted area connection a greater distance than it extends in the opposite direction.

12. The method of increasing the gain and extending the upper frequency range of a semiconductive amplifier having spaced restricted area contacts and a large area contact on a semiconductive body that comprises applying between one of said restricted area contacts and said large area contact a relatively high voltage poled to force electrons into the semiconductive body, while another restricted area contact is connected to the semiconductive body through said large area contact.

13. The method of improving the amplification of a semiconductive amplifier comprising a body of N-type germanium material having emitter, collector and base connections, that comprises sending a relatively high reverse current through the collector connection while sending a small forward current through the emitter connection.

14. A semiconductor translator comprising a body of semiconductive material, spaced restricted area connections on said body and a large area connection on the body spaced from each restricted area connection, said body including an electrically formed portion under one restricted area connection, the margin of said portion being close to the other restricted area connection.

15. The method of improving the amplification of a semiconductive amplifier having restricted area contacts and a large area contact on a semiconductive body, that comprises applying a voltage between one of said restricted area contacts and said large area contact of sufficient magnitude to carry the voltage-current characteristic of said one of said restricted area contacts into the negative resistance region while another restricted area contact is connected to the semiconductive body through said large area contact.

16. The method of forming the collector connection of a semiconductive translator having emitter, collector and base connections, that comprises applying a forward bias and a signal voltage between the emitter and the base connections, applying a variable reverse bias between the collector and the base connections, increasing the collector bias while observing the effect of the signal in the collector circuit until improvement in amplification of said signal is indicated, and then removing the applied voltages.

WALTER H. BRATTAIN.

References Cited in the file of this patent

UNITED STATES PATENTS

| Number | Name | Date |
|---|---|---|
| 2,577,803 | Pfann | Dec. 11, 1951 |